(12) United States Patent
Cha

(10) Patent No.: US 9,025,406 B2
(45) Date of Patent: May 5, 2015

(54) SEMICONDUCTOR INTEGRATED CIRCUIT AND METHOD OF DRIVING THE SAME

(71) Applicant: SK Hynix Inc., Gyeonggi-do (KR)

(72) Inventor: Jin-Youp Cha, Gyeonggi-do (KR)

(73) Assignee: SK Hynix Inc., Gyeonggi-do (KR)

( * ) Notice: Subject to any disclaimer, the term of this patent is extended or adjusted under 35 U.S.C. 154(b) by 125 days.

(21) Appl. No.: 13/844,935

(22) Filed: Mar. 16, 2013

(65) Prior Publication Data

US 2014/0185356 A1 Jul. 3, 2014

(30) Foreign Application Priority Data

Dec. 27, 2012 (KR) .................. 10-2012-0155121

(51) Int. Cl.
*G11C 17/18* (2006.01)
*G11C 17/16* (2006.01)
(52) U.S. Cl.
CPC ................ *G11C 17/18* (2013.01); *G11C 17/16* (2013.01)

(58) Field of Classification Search
CPC .......... G11C 7/22; G11C 17/18; G11C 29/02; G11C 16/0441; G11C 29/027; G11C 29/50; G11C 29/787; G11C 29/812
USPC .............. 365/230.03, 205, 200, 225.7, 233.1, 365/201
See application file for complete search history.

(56) References Cited

U.S. PATENT DOCUMENTS

2009/0154272 A1* 6/2009 Chung ........................ 365/201

FOREIGN PATENT DOCUMENTS

| KR | 1020090022292 | 3/2009 |
| KR | 1020090128175 | 12/2009 |

* cited by examiner

*Primary Examiner* — Thong Q Le
(74) *Attorney, Agent, or Firm* — IP & T Group LLP

(57) ABSTRACT

A semiconductor integrated circuit includes a fuse circuit comprising a fuse configured to generate a fuse state signal corresponding to a rupture state of the fuse in response to an enable signal, a fuse state decision unit configured to determine whether or not the fuse state signal is normal based on a test signal, and generate an output enable signal according to a determination result, and a driving unit configured to output the fuse state signal in response to the output enable signal.

18 Claims, 4 Drawing Sheets

SEMICONDUCTOR INTEGRATED CIRCUIT AND METHOD OF DRIVING THE SAME

CROSS-REFERENCE TO RELATED APPLICATIONS

The present application claims priority of Korean Patent Application No. 10-2012-0155121, filed on Dec. 27, 2012, which is incorporated herein by reference in its entirety.

BACKGROUND

1. Field

Exemplary embodiments of the present invention relate to semiconductor design technology, and more particularly, to a semiconductor integrated circuit having a fuse circuit and a method of driving the same.

2. Description of the Related Art

Generally, a repairing defects and changing setting value of the semiconductor integrated circuit (IC) are performed through a fuse programming method.

The fuse programming method may include a programming method for cutting-off the fuse by supplying an overcurrent, a programming method for cutting-off or connecting the fuse through applying a laser beam, and a programming method for using an erasable programmable read only memory (EPROM). The programming method through applying the laser beam may be more simple and may have a low error probability so that is generally used. However, the programming method through applying the laser beam is performed in a wafer state of the semiconductor IC. Herein, the wafer state of the semiconductor IC is a step prior to the step in which the semiconductor IC is fabricated to a package. Due to the above-mentioned reasons, the programming method through applying the laser beam may be difficult to be used to the package state. Thus, in the package state, an anti-fuse may be used to repair defects in the semiconductor IC.

Since the anti-fuse has electrical characteristics opposite to those of a fuse, the anti-fuse may be simply programmed in the package state. Specifically, the anti-fuse is a resistive fuse that has a high resistance of, for example, 100 MΩ before a program operation and has a low resistance of, for example, 100 KΩ or lower after the program operation. That is, the anti-fuse has a capacitance before the program operation and has a resistance after the program operation when the anti-fuse is a transistor of which a source and a drain are electrically coupled. The anti-fuse may be typically formed of a very thin dielectric material, such as a composite formed by interposing a dielectric material, such as SiO2, silicon nitride, tantalum oxide, or silicon dioxide-silicon nitride-silicon dioxide (ONO), between two conductive materials. During the program operation of the anti-fuse, a high voltage of, for example, about 10V is applied to anti-fuse terminals for a sufficient time to destroy the dielectric material. Thus, when the anti-fuse is programmed, an electrical short occurs between the two conductive materials of the anti-fuse, thereby reducing the resistance of the anti-fuse.

FIG. 1 is a block diagram illustrating a fuse circuit in accordance with a conventional art.

Referring to FIG. 1, a unit fuse circuit E-FUSE SET includes a driving unit 11, an electrical fuse 13 and a sensing unit 15. The driving unit 11 drives a sensing node SN to a high voltage VRUPTURE in response to a rupture enable signal RUP_EN and a rupture address RUP_ADD. The electrical fuse 13 is coupled between the sensing node SN and a ground voltage VSS terminal. The sensing unit 15 generates a fuse state signal FUSE_OUT by sensing a rupture state or resistive state of the electrical fuse 13 coupled with the sensing node SN using a sensing voltage VSENSING.

The driving unit 11 includes a NAND gate and a PMOS transistor. The NAND gate performs a logic NAND operation of rupture enable signal RUP_EN and the rupture address RUP_ADD. A gate of the PMOS transistor is coupled to an output of the NAND gate, a source and a drain are coupled to the high voltage VRUPTURE and the sensing node SN. Herein, the high voltage VRUPTURE may be high voltage level as much as the electrical fuse 13 is ruptured, for example, the high voltage VRUPTURE includes a pumping voltage VPP generated inside the semiconductor IC 200 or applied from an external.

The electrical fuse 13 includes the anti-fuse ruptured by a voltage difference between the sensing node SN and the ground voltage VSS terminal.

The sensing unit 15 outputs an initialized fuse state signal FUSE_OUT in response to a power up signal PWRUP, and changes or maintains a logic level of the fuse state signal FUSE_OUT according to whether or not the electrical fuse 13 is ruptured. Meanwhile, the sensing unit 15 uses the sensing voltage VSENSING as a source voltage, and the sensing voltage VSENSING may include a power supply voltage VDD.

FIG. 2 is a block diagram implemented with the unit fuse circuit in FIG. 1 as an array structure.

Referring to FIG. 2, the fuse set array 100 includes a plurality of unit fuse circuits E-FUSE SET<0:n>. A description of plurality of unit fuse circuits E-FUSE SET<0:n> has been described with reference to FIG. 1, so a description thereof will be omitted for the sake of convenience. The plurality of E-FUSE SET<0:n> commonly receives the common enable signal RUP_EN and the power up signal PWRUP and separately receives a plurality of addresses RUP_ADD<0:n>.

That is, the above fuse set array 100 commonly receives the common enable signal RUP_EN, the high voltage VRUPTURE, and the sensing voltage VSENSING, so that it is possible to increase an area efficiency occupied by chip.

However, the fuse set array 100 as above has the following concern.

The electrical fuse 13 is ruptured by an electrical stress in the package state, so that the unit fuse circuit E-FUSE SET cannot normally output the fuse state signal FUSE_OUT due to the electrical stress such as a voltage, a current and a time. That is to say, after electrical fuse 13 is ruptured, it may be difficult to have an exact resistance by applying the electrical stress, so that the FUSE_OUT may not be output normally. On the contrary, the electrical fuse 13 is ruptured by applying the electrical stress without intension, the state signal FUSE_OUT may not be output normally. When electrical fuse 13 is ruptured without intension, the electrical fuse 13 is not restored on its characteristic.

Specially, when the high voltage VRUPTURE and the sensing voltage VSENSING are commonly used as a source voltage in one unit fuse circuit E-FUSE SET, the unit fuse circuit E-FUSE SET is in a stressful environmental.

SUMMARY

Various exemplary embodiments of the present invention are directed to providing a semiconductor IC for controlling an output of a fuse state signal in accordance to whether the fuse state signal is normal or not.

Another exemplary embodiment of the present invention is directed to providing a semiconductor IC for monitoring the fuse state signal and providing a monitoring results to an external.

In accordance with an embodiment of the present invention, a semiconductor IC includes a fuse circuit including a fuse configured to generate a fuse state signal corresponding to a rupture state of the fuse in response to an enable signal, a fuse state decision unit configured to determine whether or not the fuse state signal is normal based on a test signal, and generate an output enable signal according to a determination result, and a driving unit configured to output the fuse state signal in response to the output enable signal.

In accordance with another embodiment of the present invention, a semiconductor IC includes a fuse set array including a plurality of unit fuse circuits, each of the unit fuse circuits including a fuse, configured to generate a plurality of fuse state signals corresponding to rupture states of fuses in response to a common enable signal and a plurality of addresses, a fuse state decision unit configured to determine whether or not each of the plurality of fuse state signals is normal in response to a test signal, and generate an output enable signal according to a determination result, and a driving unit configured to output each of the plurality of fuse state signal in response to an output enable signal.

In accordance with yet another embodiment of the present invention, a method for driving a semiconductor IC including a fuse set array that has a plurality of unit fuse circuits, the method includes programming fuses included in the plurality of unit fuse circuits, comparing a plurality of test signals with a plurality of fuse state signals and generating a monitoring signal based on comparison result, generating an output enable signal in response to the monitoring signal; and outputting the plurality of fuse state signals in response to the output enable signal.

DETAILED DESCRIPTION

Figure 1:
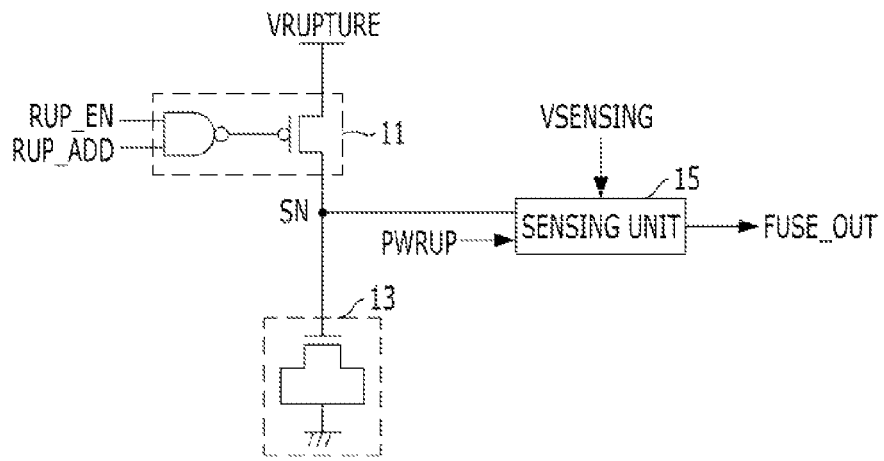
FIG. 1 is a block diagram illustrating a fuse circuit in accordance with a conventional art.
Figure 2:
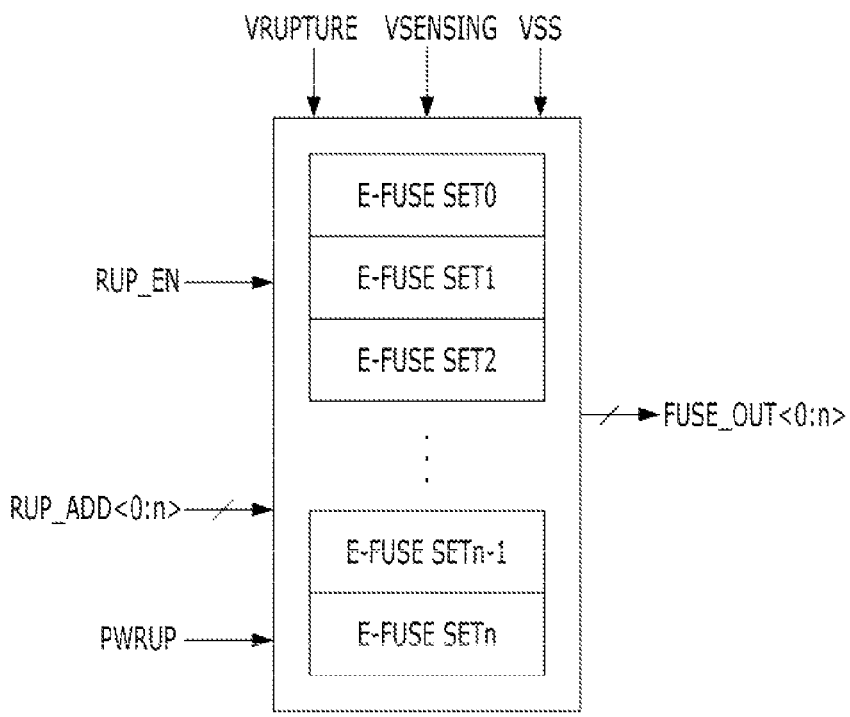
FIG. 2 is a block diagram implemented with the unit fuse circuit in FIG. 1 as an array structure.

Exemplary embodiments of the present invention will be described below in more detail with reference to the accompanying drawings. The present invention may, however, be embodied in different forms and should not be construed as being limited to the embodiments set forth herein. Rather, these embodiments are provided so that this disclosure will be thorough and complete, and will fully convey the scope of the present invention to those skilled in the art. Throughout the disclosure, like reference numerals refer to like parts throughout the various figures and embodiments of the present invention.

In the present invention, the same reference numerals used in the prior art denote the same signals.

Figure 3:
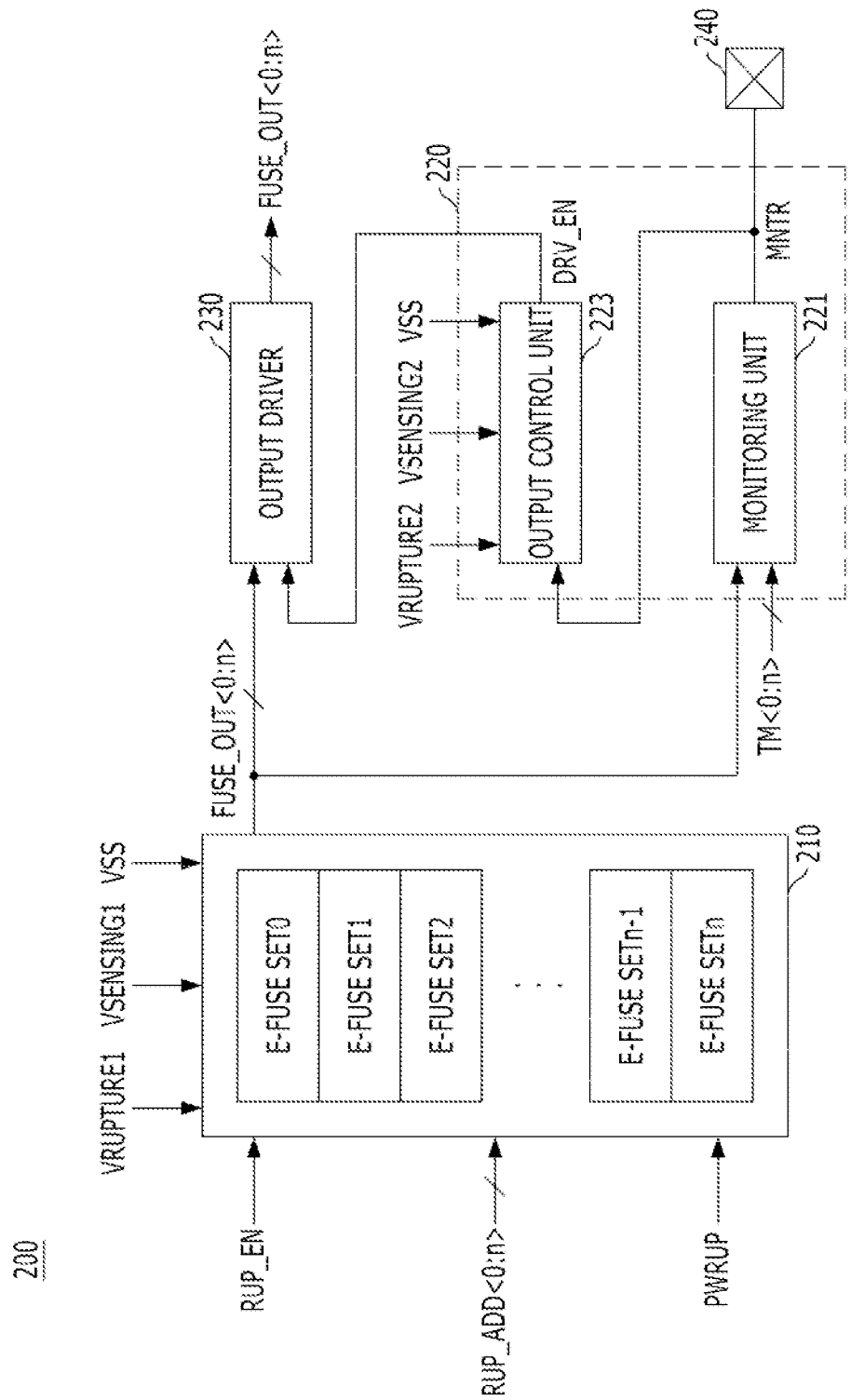
FIG. 3 is a block diagram illustrating a semiconductor IC in accordance with an exemplary embodiment of a present invention.
Figure 4:
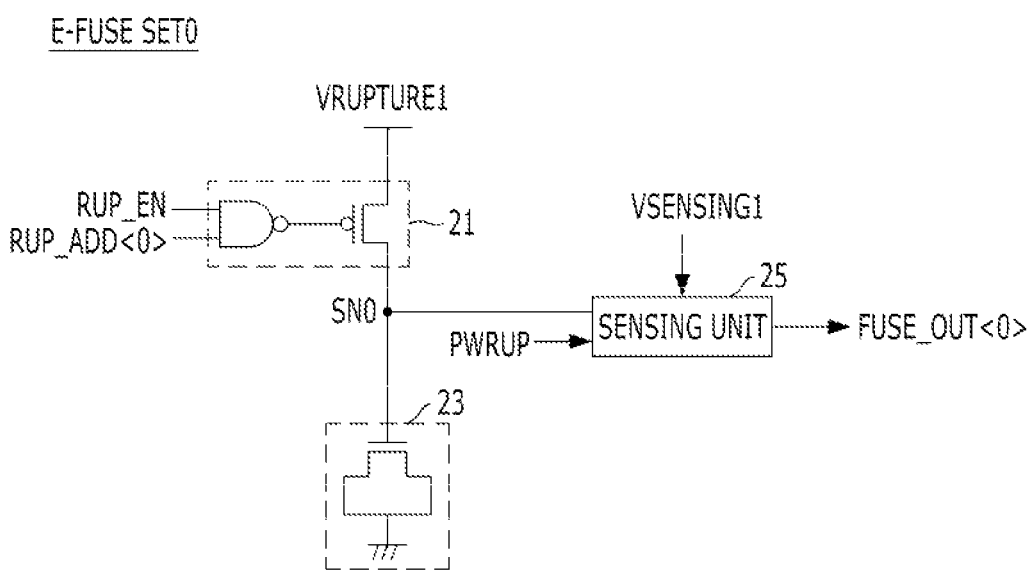
FIG. 4 is a block diagram illustrating a fuse circuit in accordance with an exemplary embodiment of a present invention.

FIG. 3 is a block diagram illustrating a semiconductor integrated circuit (IC) in accordance with an exemplary embodiment of a present invention. FIG. 4 is a diagram illustrating a unit fuse circuit of FIG. 3.

Referring to FIG. 3, the semiconductor IC 200 includes a fuse set array 210, a fuse state decision unit 220, an output driver 230 and a pad 240. The fuse set array 210 generates a plurality of fuse state signals FUSE_OUT<0:n> in response to a common enable signal RUP_EN and a plurality of addresses RUP_ADD<0:n>. The fuse state decision unit 220 determines whether or not the plurality of fuse state signals FUSE_OUT<0:n> is normal in response to a plurality of test signals TM<0:n>. The output driver 230 outputs the plurality of fuse state signals FUSE_OUT<0:n> to an internal circuit (not shown) in response to an output enable signal DRV_EN from the fuse state decision unit 220. The pad 240 provides an external with a monitoring signal MNTR from the fuse state decision unit 220.

Herein, the fuse set array 210 includes a plurality of unit fuse circuits E-FUSE SET<0:n>. The plurality of unit fuse circuits E-FUSE SET<0:n> are supplied a first high voltage Vrupture1, a first sensing voltage VSENSING1, and a ground voltage VSS, and output the plurality of fuse state signals FUSE_OUT<0:n> corresponding to a rupture state of the fuse comprised in the plurality of unit fuse circuits E-FUSE SET<0:n> in response to the common enable signal RUP_EN and each of plurality of addresses RUP_ADD<0:n>. Since each of the plurality of unit fuse circuits E-FUSE SET<0:n> has the same configurations, for convenience of description, only a first unit fuse circuit E-FUSE SET<0> will be described with reference to FIG. 4.

Referring to FIG. 4, the first unit fuse circuit E-FUSE SET<0> includes a driving unit 21, a fuse 23, and a sensing unit 25. The driving unit 21 drives a sensing node SN0 to the first high voltage VRUPTURE1 in response to the common enable signal RUP_EN and a first address RUP_ADD<0>. The fuse 23 is coupled between the sensing node SN0 and a ground voltage VSS terminal. The sensing unit 25 is coupled to the sensing node SN0 to output a first fuse state signals FUSE_OUT<0> corresponding to a rupture state or a resistor state of the fuse 23.

Herein, the driving unit 21 includes a NAND gate and a PMOS transistor. The NAND gate performs a NAND operation of the common enable signal RUP_EN and the first address RUP_ADD<0>. The PMOS transistor has a gate coupled with an output of the NAND gate and a source and drain coupled between the first high voltage VRUPTURE1 and the sensing node SN0. In this case, it is desirable that the first high voltage VRUPTURE1 has a high level voltage as much as the fuse 23 is ruptured. For example, the first high voltage VRUPTURE1 includes a pumping voltage VPP which is generated inside the semiconductor IC 200 or supplied from an external. The fuse 23 includes an electrical fuse. For example, the fuse 23 includes an anti-fuse ruptured by a voltage difference between two terminals of the anti-fuse.

Also, the sensing unit 25 outputs and maintains the initialized first fuse state signals FUSE_OUT<0> in response to the power up signal PWRUP, and changes a logic level of the first fuse state signals FUSE_OUT<0> corresponding to whether or not the fuse 23 is ruptured. The sensing unit 25 uses a first sensing voltage VSENSING1 as a source voltage and the first sensing voltage VSENSING1 includes a power supply voltage VDD.

Referring back to FIG. 3, the fuse state decision unit 220 includes a monitoring unit 221 and an output control unit 223. The monitoring unit 221 monitors the plurality of fuse state signals FUSE_OUT<0:n> in response to the plurality of test signals TM<0:n>, outputs a monitoring signal MNTR. The output control unit 223 generates the output enable signal DRV_EN in response to the monitoring signal MNTR from the monitoring unit 221. Herein, the monitoring unit 221 compares the plurality of test signals TM<0:n> with the plurality of fuse state signals FUSE_OUT<0:n> and outputs the monitoring signal MNTR corresponding to the comparison result. For reference, the plurality of test signals TM<0:n> includes code signals corresponding to the plurality of fuse state signals FUSE_OUT<0:n> and the code signals is generated inside the semiconductor IC 200 or applied from the external. The output control unit 223 has an identical configuration to the first unit fuse circuit E-FUSE SET0. The output control unit 223 receives a second high voltage VRUPTURE 2 and a second sensing voltage VSENSING 2 which are electrically separated from the first high voltage VRUPTURE1 and the first sensing voltage VSENSING1.

Figure 5:
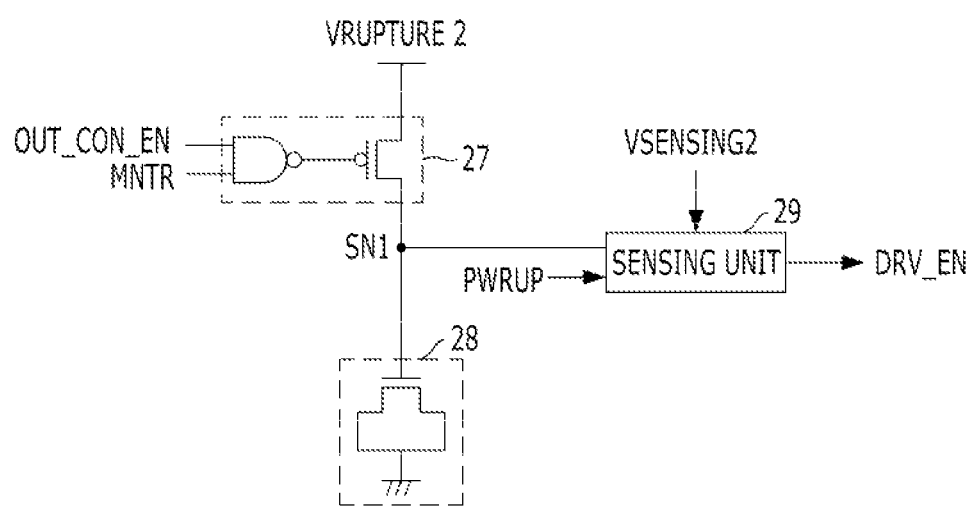
FIG. 5 is a block diagram illustrating an output controller in accordance with another exemplary embodiment of present invention.

Accordingly, referring to FIG. 5, the output control unit 223 includes a driving unit 27, a fuse 28, and a sensing unit 29. The driving unit 27 drives a sensing node SN1 to the second high voltage VRUPTURE2 in response to an output control enable signal OUT_CON_EN and the monitoring signal MNTR. The fuse 28 is coupled between the sensing node SN1 and the ground voltage VSS terminal. The sensing unit 29 is coupled to the sensing node SN1 to output the output enable signal DRV_EN corresponding to a rupture state or a resistor state of the fuse 28. The driving unit 27 included in the output control unit 223 may be controlled by the monitoring signal MNTR without the output enable signal DRV_EN.

Hereinafter, an operation of a semiconductor IC in accordance with an exemplary embodiment of the present invention will be described with reference to FIGS. 3 to 5.

First of all, each of fuses 23 included in the plurality of unit fuse circuits E-FUSE SET<0:n> is programmed. For example, the plurality of unit fuse circuits E-FUSE SET<0:n> are sequentially programmed by the common enable signal RUP_EN and the plurality of addresses RUP_ADD<0:n>. When the programming of the plurality of unit fuse circuits E-FUSE SET<0:n> is completed, each of the plurality of unit fuse circuits E-FUSE SET<0:n> outputs and maintains the plurality of fuse state signals FUSE_OUT<0:n> corresponding to whether or not the fuse 23 is ruptured.

Then, the monitoring unit 221 compares the plurality of test signals TM<0:n> with the plurality of fuse state signals FUSE_OUT<0:n> and outputs the monitoring signal MNTR corresponding to the comparison result. For example, the monitoring unit 221 compares each of the plurality of test signals TM<0:n> with each of the plurality of fuse state signals FUSE_OUT<0:n> and combines or compresses the comparison result to outputs a single bit of the monitoring signal MNTR.

The output control unit 223 outputs the output enable signal DRV_EN in response to the monitoring signal MNTR.

If the comparison result of the monitoring unit 221 is that the plurality of fuse state signals FUSE_OUT<0:n> are identical to the plurality of test signals TM<0:n>, the output control unit 223 activates the output enable signal DRV_EN.

On the contrary, if the comparison result of the monitoring unit 221 is that the plurality of fuse state signals FUSE_OUT<0:n> are not identical to the plurality of test signals TM<0:n>, the output control unit 223 inactivates the output enable signal DRV_EN. The output control unit 223 determines a logic level of the output enable signal DRV_EN through a programming of the fuses included in the output control unit 223 itself, for example, the plurality of unit fuse circuits E-FUSE SET<0:n>. In this case, the output control unit 223 uses the second high voltage VRUPTURE2 and the second sensing voltage VSENSING2 as a source voltage, which are electrically separated from the first sensing voltage VSENSING1 and the first high voltage VRUPTURE1 supplied to the plurality of unit fuse circuits E-FUSE SET<0:n so that interference between the plurality of unit fuse circuits E-FUSE SET<0:n> may be minimized.

The output driver 230 outputs the plurality of fuse state signals FUSE_OUT<0:n> in response to the output enable signal DRV_EN to the internal circuit when the plurality of fuse state signals FUSE_OUT<0:n> are normal and the output driver 230 blocks the plurality of fuse state signals FUSE_OUT<0:n> to the internal circuit when the plurality of fuse state signals FUSE_OUT<0:n> are abnormal.

The monitoring signal MNTR is provided to the external through the pad 240 so that the monitoring result may be monitored in the external.

In accordance with the embodiments of the present invention, it is possible to prevent a malfunction of the internal circuit due to an abnormal fuse sate signal FUSE_OUT by outputting a normal fuse sate signal FUSE_OUT.

Further, it is possible to provide a monitoring result of the fuse sate signal FUSE_OUT to the external through the pad. Accordingly, there are advantages in that a monitoring result of the fuse sate signal FUSE_OUT may be easily confirmed in the external.

Although the spirit of the present invention was described in detail with reference to the preferred embodiments, it should be understood that the preferred embodiments are provided to explain, but do not limit the spirit of the present invention. Also, it is to be understood that various changes and modifications within the technical scope of the present invention are made by a person having ordinary skill in the art to which this invention pertains.

Further, the logic gate and the transistor described in the foregoing embodiments may be implemented to have different positions and kinds according to polarity of an input signal.

While the present invention has been described with respect to the specific embodiments, it will be apparent to those skilled in the art that various changes and modifications may be made without departing from the spirit and scope of the invention as defined in the following claims.

What is claimed is:

1. A semiconductor integrated circuit (IC), comprising:
    a fuse circuit comprising a fuse configured to generate a fuse state signal corresponding to a rupture state of the fuse in response to an enable signal;
    a fuse state decision unit configured to determine whether or not the fuse state signal is identical to a test signal, and generate an output enable signal according to a determination result; and
    a driving unit configured to output the fuse state signal in response to the output enable signal.

2. The semiconductor IC of claim 1, wherein the fuse state decision unit comprises:
    a monitoring unit configured to output a monitoring signal by monitoring the fuse state signal based on the test signal; and
    an output control unit configured to generate the output enable signal in response to the monitoring signal.

3. The semiconductor IC of claim 2, wherein the monitoring unit compares the test signal with the fuse state signal to output the monitoring signal corresponding to a comparison result.

4. The semiconductor IC of claim 2, further comprising:
    a pad configured to provide the monitoring signal to an external.

5. The semiconductor IC of claim 2, wherein the output control unit is configured to receive a source voltage electrically separated from a source voltage used in the fuse circuit, and the output control unit and the fuse circuit have an identical configuration.

6. A semiconductor integrated circuit (IC), comprising:
a fuse set array comprising a plurality of unit fuse circuits, each of the unit fuse circuits including a fuse, configured to generate a plurality of fuse state signals corresponding to rupture states of fuses in response to a common enable signal and a plurality of addresses;
a fuse state decision unit configured to determine whether or not each of the plurality of fuse state signals is identical to a test signal, and generate an output enable signal according to a determination result; and
a driving unit configured to output each of the plurality of fuse state signal in response to an output enable signal.

7. The semiconductor IC of claim 6, wherein the fuse state decision unit comprises:
a monitoring unit configured to output a monitoring signal by monitoring each of the plurality of fuse state signal based on the test signal; and
an output control unit configured to generate the output enable signal in response to the monitoring signal.

8. The semiconductor IC of claim 6, wherein each of the plurality of unit fuse circuits comprises:
a first driving unit configured to drive a first sensing node to a first high voltage in response to the common enable signal and each address;
a first fuse coupled between the first sensing node and a low voltage terminal; and
a first sensing unit coupled to the first sensing node, and configured to output each of the plurality of fuse state signals corresponding to a rupture state of the first fuse.

9. The semiconductor IC of claim 8, wherein the first sensing unit is configured to be initialized by a power up signal and use a first sensing voltage lower than the first high voltage as a source voltage.

10. The semiconductor IC of claim 7, wherein the test signal comprises a plurality of code signals corresponding to the plurality of fuse state signals, wherein the monitoring unit compares each of the plurality of code signals with each of the plurality of fuse state signals to output the monitoring signal corresponding to a comparison result.

11. The semiconductor IC of claim 7, further comprising:
a pad configured to provide the monitoring signal to an external.

12. The semiconductor IC of claim 8, wherein the output control unit comprises:

a second driving unit configured to drive a second sensing node to a second high voltage in response to the monitoring signal;
a second fuse coupled between the second sensing node and a low voltage terminal; and
a second sensing unit coupled to the second sensing node, and configured to output each of the output enable signals corresponding to a rupture state of the second fuse.

13. The semiconductor IC of claim 12, wherein the second sensing unit is configured to be initialized by a power up signal, and use a second sensing voltage lower than the second high voltage as a source voltage.

14. The semiconductor IC of claim 13,
wherein the first high voltage and the second high voltage are separately supplied through electrically separated voltage terminals, and
wherein the first sensing voltage and the second sensing voltage are separately supplied through electrically separated voltage terminal.

15. A method for driving a semiconductor integrated circuit (IC), the method comprising:
programming fuses comprised in a plurality of unit fuse circuits;
comparing a plurality of test signals with a plurality of fuse state signals to determine whether or not the plurality of fuse state signals are identical to the plurality of fuse state signals test signals and generating a monitoring signal based on comparison result;
generating an output enable signal in response to the monitoring signal; and
outputting the plurality of fuse state signals in response to the output enable signal.

16. The method of claim 15, wherein the generating the monitoring signal comprises:
providing the single bit of monitoring signal to an external through a pad.

17. The method of claim 15, wherein the generating the output enable signal comprises:
activating the output enable signal when the plurality of fuse state signals are identical to the plurality of test signals and inactivating the output enable signal when the plurality of fuse state signals are not identical to the plurality of test signals.

18. The method of claim 15, wherein the generating the output enable signal is performed through a fuse programming method.

* * * * *